United States Patent
Kao et al.

(10) Patent No.: US 8,044,678 B2
(45) Date of Patent: Oct. 25, 2011

(54) DEVICE FOR SIMULATING RECTIFIED CONSTANT IMPEDANCE LOAD AND METHOD THEREOF

(75) Inventors: Hung-Hsiang Kao, Taoyuan Hsien (TW); Wen-Chung Chen, Taoyuan Hsien (TW); Kuo-Cheng Liu, Taoyuan Hsien (TW); Ming-Ying Tsou, Taoyuan Hsien (TW)

(73) Assignee: Chroma Ate Inc., Taoyuan Hsien (TW)

( * ) Notice: Subject to any disclaimer, the term of this patent is extended or adjusted under 35 U.S.C. 154(b) by 553 days.

(21) Appl. No.: 12/244,346

(22) Filed: Oct. 2, 2008

(65) Prior Publication Data
US 2009/0091958 A1    Apr. 9, 2009

(30) Foreign Application Priority Data
Oct. 3, 2007    (TW) ................................ 96137164 A

(51) Int. Cl.
*G01R 31/40* (2006.01)
*G06F 15/00* (2006.01)
(52) U.S. Cl. .................................. 324/764.01; 702/124
(58) Field of Classification Search ............. 324/764.01; 702/124
See application file for complete search history.

(56) References Cited

U.S. PATENT DOCUMENTS

| 7,212,021 B2 * | 5/2007 | Karnik et al. ............ 324/762.02 |
| 2006/0273811 A1 | 12/2006 | Haigh et al. |
| 2007/0103168 A1 | 5/2007 | Batten et al. |

* cited by examiner

*Primary Examiner* — David Mis
(74) *Attorney, Agent, or Firm* — Birch, Stewart, Kolasch & Birch, LLP

(57) ABSTRACT

The device for simulating a rectified constant impedance load provide by the present invention is to test a power product and comprises an analog-digital converter, a digital signal processor, a digital-analog converter, and an active electrical load module in order to replacing the passive components of a traditional rectified passive load. method for simulating a rectified constant impedance load being applied to test a power product and comprising the steps of: (S1) replacing the plurality of passive components of the rectified constant impedance load with a digital control module and an active electrical load module; (S2) establishing a passive load model function in order to represent the application relationships of the plurality of the passive components; (S3) executing the operation of the passive load model function by the digital control module in order to gain a load current value, and transferring the load current value to an analog control signal via the digital control module; and (S4) controlling the active electrical load module via the analog control signal so as to draw currents from the power product.

11 Claims, 4 Drawing Sheets

DEVICE FOR SIMULATING RECTIFIED CONSTANT IMPEDANCE LOAD AND METHOD THEREOF

BACKGROUND OF THE INVENTION

1. Field of the Invention

The present invention generally relates to a device for simulating a rectified constant impedance load and a method thereof, more particularly to a device that simulates a rectified constant impedance load via an active electrical load.

2. Description of the Prior Art

An AC power product, such as UPS, etc., is widely applied in our normal life. And the scope of such application comprises general information, communication, consumer electronics, transportations, industry, military, etc. The functions to the power products are to drive electrical components and maintain voltages so as to keep a whole system working well. Hence, the main factors to the design of a power device are to decrease cost and increase liability.

General AC power products are mostly for routine works, and sometimes are no-loaded. The load characteristic of the routine work equipment is RLC (resistor, inductor, capacitor) load. Therefore, the characteristics of such AC power products are tested by RLC load. And a designer must consider the application situations of RLC load while in the step of design, that is, the control circuit shall be focused for stability.

General rectified AC load can be simulated by a network consisted of passive components as resistor, inductor, capacitor, diode, etc. And the manufacturers directly use such components to form a load circuit, as shown in FIG. 1A, which illustrates a schematic view of a rectified constant impedance load circuit. The disadvantage of such circuit is the volume thereof will be huge while demanding larger power; and it is inconvenient to adjust resistor value, capacitance value or induction value.

With reference to FIG. 1A, which represents that using a rectified constant impedance load (RECTCZLOAD) to test the characteristics of the AC power product. The rectified constant impedance load 100 includes a bridge rectifier 102, a serial resistor Rs, a serial inductor Ls, a load capacitor C, and a load resistor $R_L$. The bridge rectifier 102 is usually consisted of four diodes in order to adjust the input voltage of an AC power product 200 to be the format of whole wave. The load capacitor C and the load resistor $R_L$ are a parallel connection, and then the parallel connection is serially connected to the bridge rectifier 102, the serial resistor Rs and the inductor Ls in order to form a rectified constant impedance load network for testing the AC power product 200. While the AC power product 200 is connected to the network and an output voltage is produced, the output load current is then known; further, the variation of the voltage caused by the load network is known as well.

With reference to FIG. 1B, which illustrates a voltage/current variation chart of testing the rectified constant impedance load of FIG. 1A. The rectified constant impedance load has a characteristic of pull as described below. When the load applied to the DUT, due to the output impedance characteristics (generally inductive), the output voltage of the DUT will be distorted when the load current has a value of higher CF (>2.5), which represent the steepness of the load current. Higher is the CF, larger the distortion of the output voltage of the DUT will be.

As aforesaid, the rectified constant impedance load may need resistors, capacitors, inductors, bridge rectifiers, etc. Each component will also need some other different components. Especially the volumes of the serial resistors Rs and the load resistors $R_L$ are huge, thus the idea of using an electrical load means for simulation is then produced.

However, general AC electrical load only provides the functions with certain currents, certain power, etc. Such functions are set by a controller and without the consideration of the voltage variation of the tested object; thus, a designed load waveform is directly drawn. Due to the load control signal without referring to the voltage of the tested object, an instance response can not be made for the output voltage variation of the tested object. So, the real simulation for the load characteristic can not reach.

Therefore, how to figure out the disadvantages of prior arts is an important issue to the skilled people in the art.

SUMMARY OF THE INVENTION

The primary objective of the present invention is to provide a device for simulating a rectified constant impedance load. The device is smaller in order to be convenient for application and precisely simulates the characteristics of a practical circuit consisted of several passive components so as to respond the output voltage of a tested object in time.

The device for simulating a rectified constant impedance load provide by the present invention is to test a power product and comprises: an analog-digital converter, which is electrically connected to the power product in order to convert to the output voltage of the power product to a digital voltage value; a digital signal processor, which is electrically connected to the analog-digital converter in order to let the digital voltage value be applied by a passive load model function for determining a load current value; a digital-analog converter, which is electrically connected to the digital signal processor in order to convert the load current value to an analog control signal; and an active electrical load module, which one end is electrically connected to the digital-analog converter for receiving the analog control signal and the other end is electrically connected to the power product for receiving a rectified voltage, a load current is produced according to the analog control signal and the rectified voltage.

The power product is an AC power product. The passive load model function comprises a resistance value, a capacitance value, or the relationships of an induction value, a voltage value and a current value.

Preferably, the device further comprises a voltage/current measuring circuit, which is electrically connected to the analog-digital converter and the power product so as to measure the output voltage. The rectified voltage is the output voltage of a bridge rectifier, which is electrically connected to the power product and the active electrical load module so as to produce the rectified voltage. The active electrical load module is an amplifier consisted of NPN-type bipolar junction transistors (BJT).

The method for simulating a rectified constant impedance load provided by the present invention comprises the steps of: (S1) replacing the plurality of passive components of the rectified constant impedance load with a digital control module and an active electrical load module; (S2) establishing a passive load model function in order to represent the application relationships of the plurality of the passive components; (S3) transferring the output voltage of the power product to a digital voltage value via the digital control module; (S4) executing the operation of the passive load model function by the digital control module in order to gain a load current value, wherein the digital voltage value is applied by the passive load model function, and then transferring the output voltage of the power product to a digital voltage value via the digital control module; and (S5) controlling the active electrical load module via the load current value so as to draw load currents from the power product.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE INVENTION

The present invention adopts the cooperation of digital control technology and an active electrical load module, a voltage/current measuring circuit, and a high-speed equipment, such as digital signal processor (DSP), analog-digital converter (ADC), digital-analog converter (DAC), etc. for simulating rectified constant impedance load circuits. A user is able to input the setting values of a serial resistance Rs, a serial inductance Ls, a load capacitance C, and a load resistance $R_L$ based on demands and refer to the voltage of a tested object in time. Continuously, a load current is calculated by the digital control technology and high-speed digital hardware, and then load drawing to the tested object is being processed. The load characteristics of RLCs can be simulated so as to decrease the volume of the load and increase the convenience to operations.

Following will be the figures of the present invention and the preferred embodiments, which describe in detail.

Figure 2:
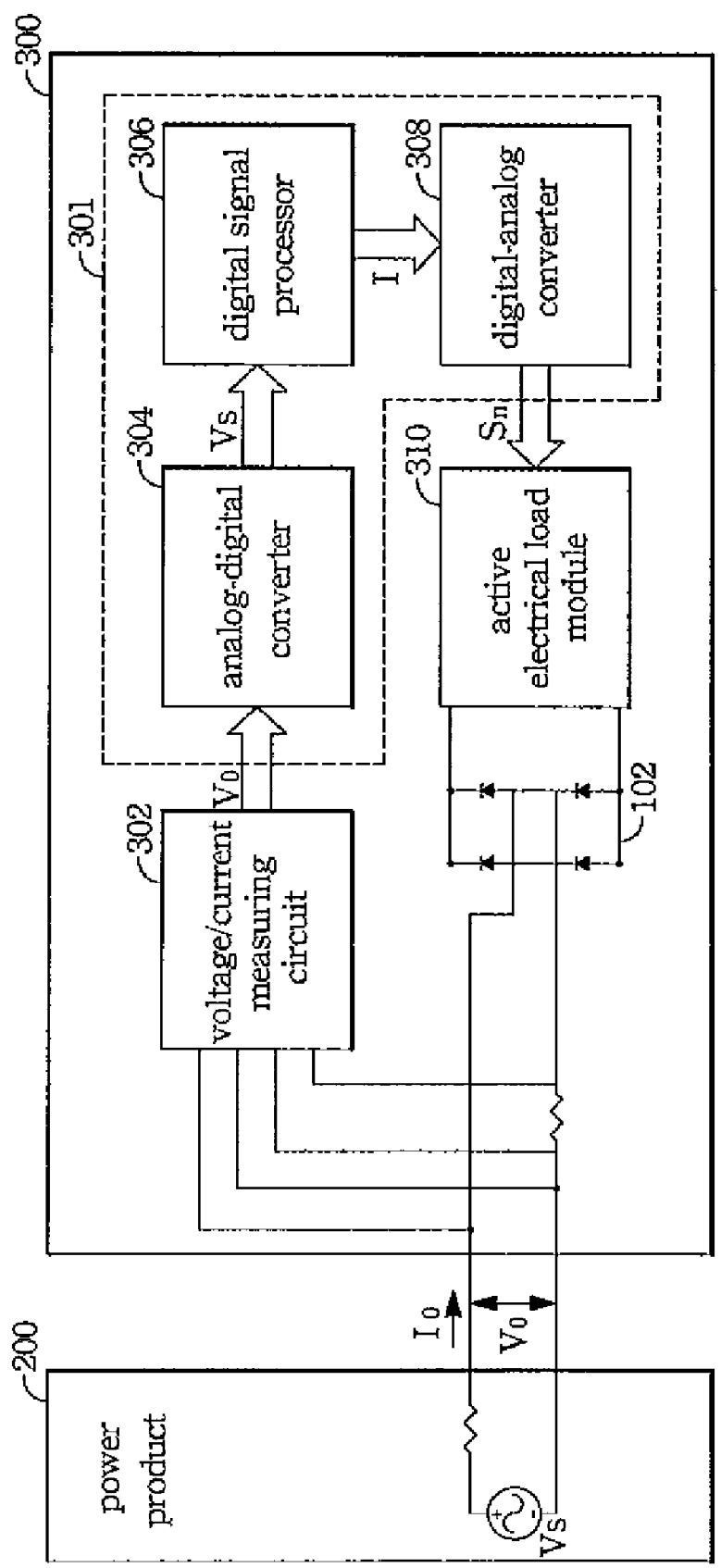
FIG. 2 illustrates a schematic view of a device for simulating a rectified constant impedance load of the present invention.

With reference to FIG. 2, which illustrates a schematic view of a device for simulating a rectified constant impedance load of the present invention, wherein the device is applied to test a power product 200. The device 300 for simulating the rectified constant impedance load includes a voltage/current measuring circuit 302, an analog-digital converter 304, a digital signal processor 306, a digital-analog converter 308, an active electrical load module 310, and a bridge rectifier 102.

The structure of a circuit is described as following. The voltage/current measuring circuit 302 is parallel to the bridge rectifier 102 and electrically connected to the analog-digital converter 304, which is electrically connected to the digital signal processor 306. Again, the digital signal processor 306 is electrically connected to the digital-analog converter 308, which is electrically connected to the active electrical load module 310. The one end of the active electrical load module 310 is electrically connected to the bridge rectifier 102.

While the device 300 is connected to the AC power product 200, the voltage/current measuring circuit 302 measures the output voltage Vs of the AC power product 200, and the bridge rectifier 102 commutates the AC power product in the aspect of whole wave. After measuring the voltage, the output voltage Vs is transferred to a digital voltage value by the analog-digital converter 304 in order to let the digital voltage value be applied by a passive load model function for determining a load current value I via floating point operation. The digital-analog converter 308 again transfers the load current value I to an analog control signal Sn, which is delivered to the active electrical load module 310.

The derivation flow of the passive load model function is as below. With references to FIG. 1A, which is a rectified passive component load circuit, and Kirchhoff's voltage law and Kirchhoff's current law, the simultaneous equations are as:

$$V_s - 2V_D - Ls\frac{dI}{dt} - IRs = Vc,$$

$$C\frac{dVc}{dt} + \frac{Vc}{RL} = I,$$

the passive load model function includes resistance values $Rs/R_L$, a capacitance value C, or an induction value Ls, voltage values Vs/Vc and a current value I. VD is defined as the drop of full bridge diode rectifier. Vs is defined as the output voltage of power. Vc is defined as the voltage of capacitor. An expected load current value I is then determined according to the digital signal processor 306.

Figure 1:
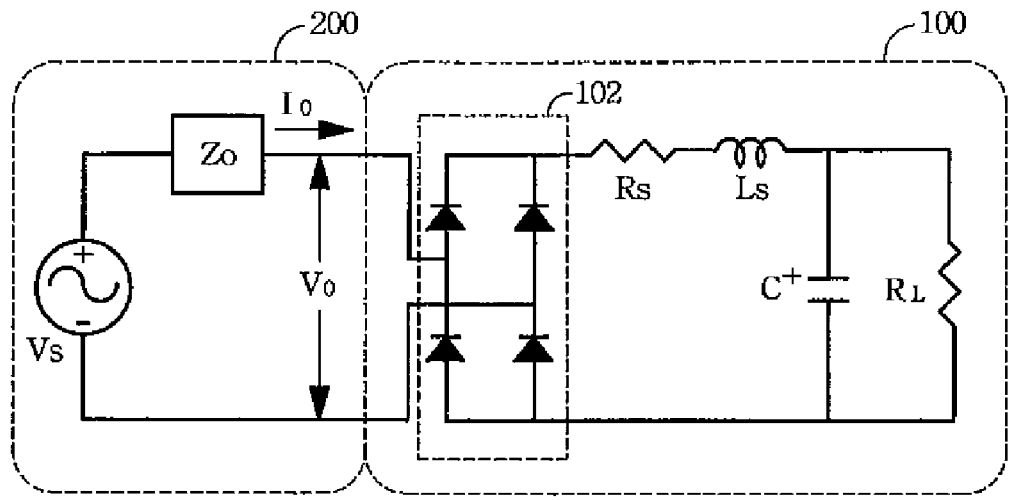
FIG. 1A represents that using a rectified constant impedance load (RECTCZLOAD) to test the characteristics of an AC power product.
FIG. 1B illustrates a voltage variation chart of testing the rectified constant impedance load of FIG. 1.
Figure 1:
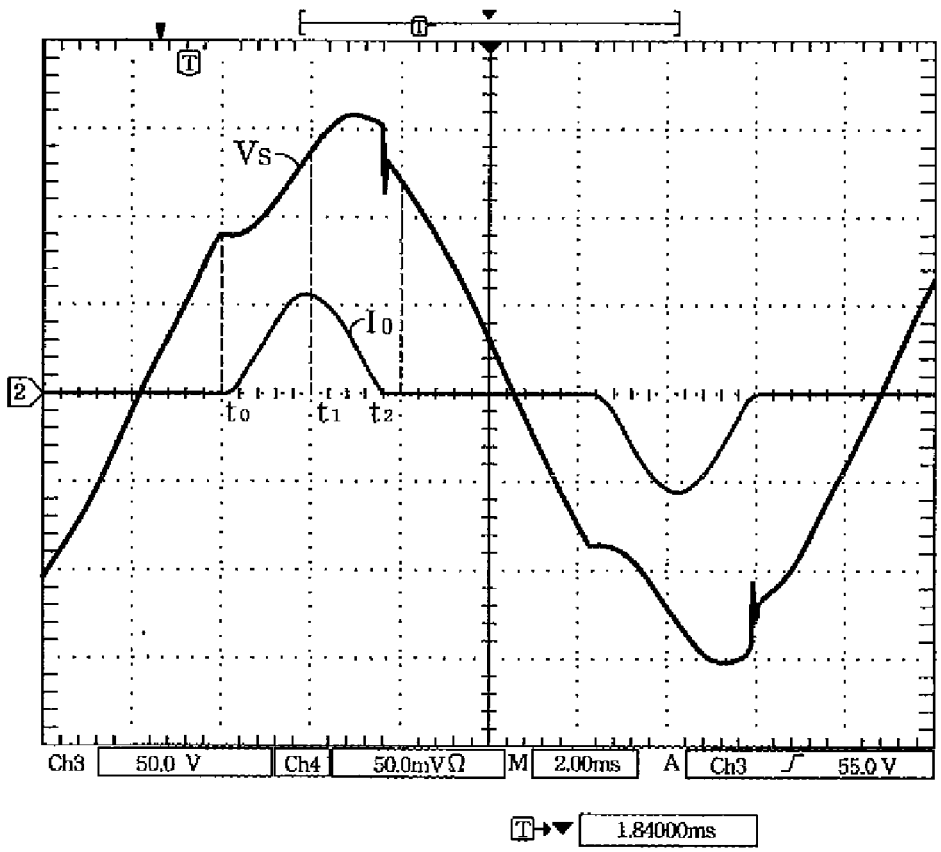

The operation relationship of said resistance value, capacitance value or induction value may be according to the relationships of the components of the rectified passive component load 100 of FIG. 1A. The resistance value is an equivalent resistance value with one or multiple serial resistors Rs and/or a load resistor $R_L$; the induction value is a simulating induction Ls; the capacitance value is an equivalent capacitance simulating one or multiple load capacitances C.

Preferably, the active electrical load module 310 is an amplifier consisted of NPN-type bipolar junction transistors (BJT). As an example of a common-emitter amplifier consisted of NPN-type bipolar junction transistors, which collector resistor ground end and emitter resistor ground end ($R_E$ ground end) receive the output voltage of the bridge rectifier 102, called rectified voltage Vb. Under an active mode, the collector end is as an ideal constant current source. The current value is determined by a base voltage $V_B$. Based on above characteristics, the analog control signal Sn can be a control voltage signal of the base in order to control that the current value of the collector is equal to the set load current value I.

As mentioned above, according to the digital signal processor and the parameters of R, L and C, the simulated passive load current is thus gained. That is, the simulated passive load current is the same as the load current of the real passive components, as shown in FIG. 1A. As well as the characteristics of the real load, the simulated passive load current will change with time and input voltage. The amplitude of the current will change as load value of the real passive component. In another word, the set values of Rs, Ls, C, and $R_L$ and the input voltage of a tested AC power product can be input by the user arbitrarily. Therefore, the characteristic is a constant impedance.

The analog-digital converter 304 is to acquire voltage signals. The digital signal processor 306 is to calculate the passive load model function and apply the calculated load current value according to the acquired voltage signals in order to let the digital-analog converter 308 issue commands for controlling the active electrical load module 310. Hence, such assembly acts like a digital control module 301.

The digital control module 301 of the device 300 receives the output voltage Vs of the AC power product 200 and then outputs the analog control signal Sn after calculations. Based on the analog control signal Sn, the active electric load module 310 is thus controlled in order to produce an expected load current. Due to that of digitally operating and simulating, the response speeds of the analog-digital converter, the digital signal processor, the digital-analog converter, and the optimized operation speed of the algorithm are the key factors to the stability of the digital control module.

Figure 3:
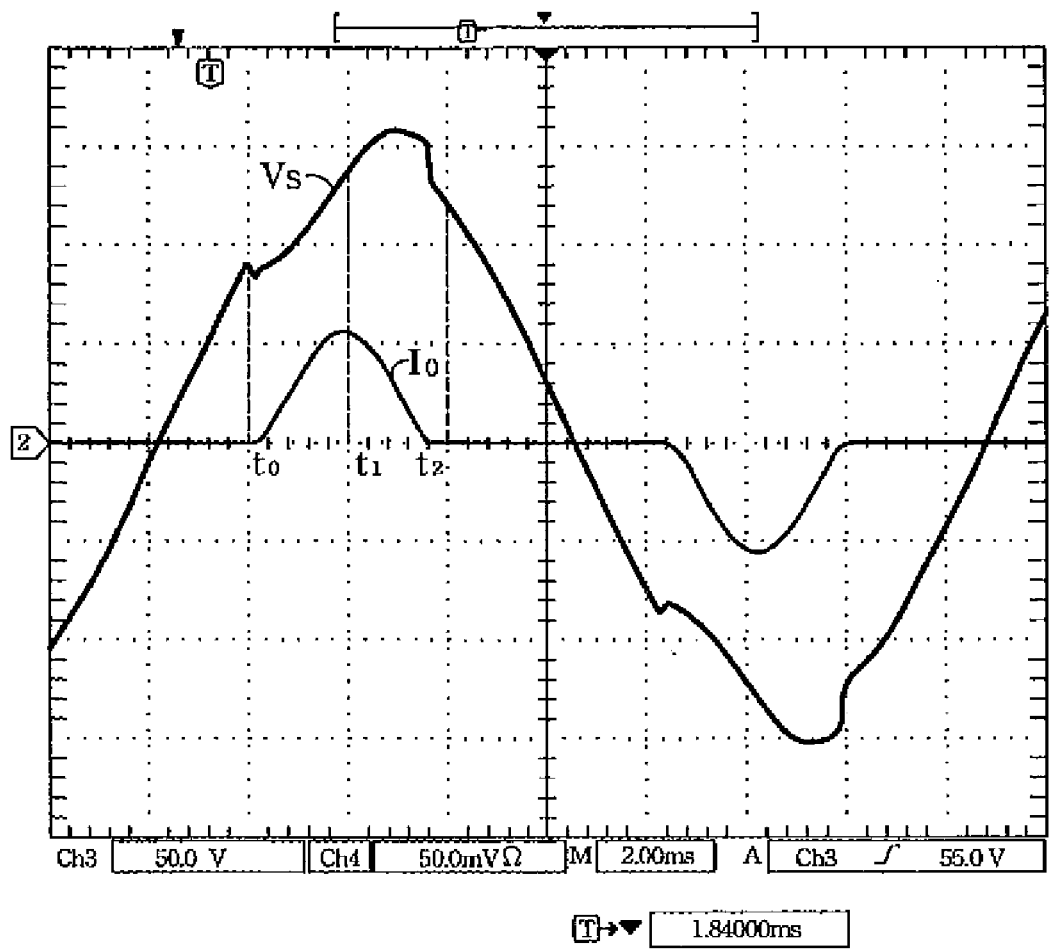
FIG. 3 illustrates a chart of the voltage (Vs) and current (Io) of a circuit unit of FIG. 1A.

With reference to FIG. 3, which illustrates a chart of the voltage (Vs) and current (Io) of a circuit unit of FIG. 1A. Namely, FIG. 3 is a simulated chart according to FIG. 2 in order to assure the reliability of the present invention. Along with FIG. 1B and FIG. 3, the characteristics of both are similar after referring to the variation of the curve Vs between time $t_o$ to $t_1$.

Figure 4:
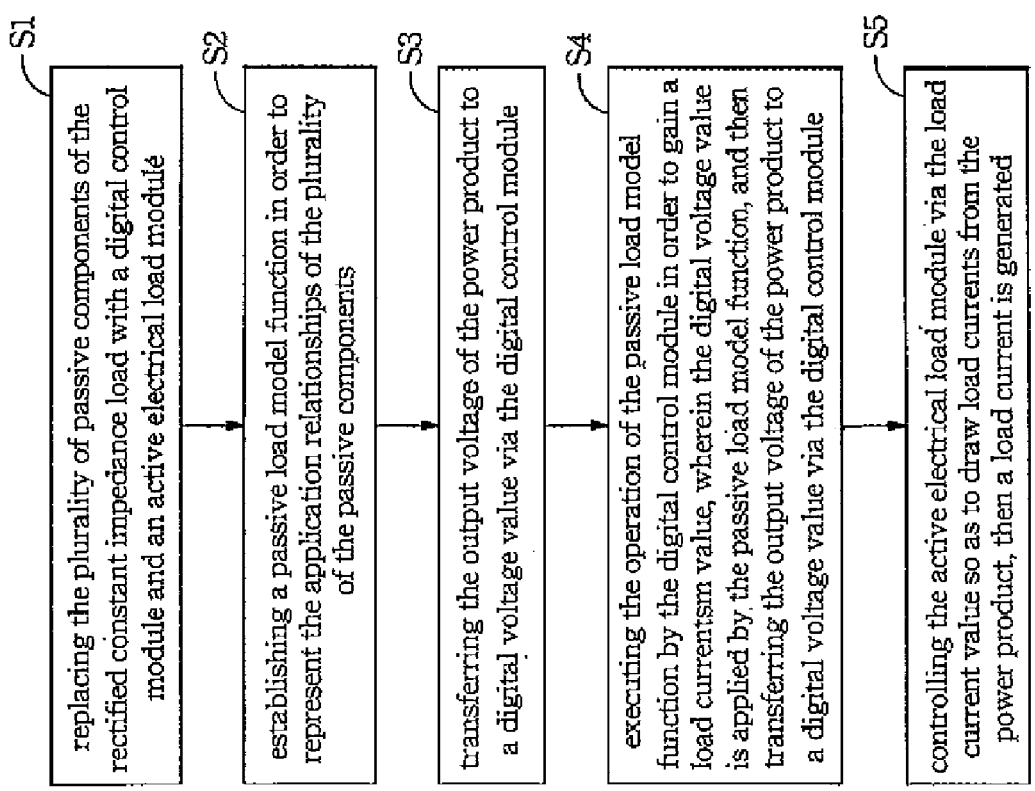
FIG. 4 illustrates a flow chart of the method for simulating the rectified constant impedance load of the present invention.

In connection with FIG. 4, which illustrates a flow chart of the method for simulating the rectified constant impedance load of the present invention. The method includes the steps of: (S1) replacing the plurality of passive components of the rectified constant impedance load with a digital control module and an active electrical load module; (S2) establishing a passive load model function in order to represent the application relationships of the plurality of the passive components; (S3) transferring the output voltage of the power product to a digital voltage value via the digital control module; (S4) executing the operation of the passive load model function by the digital control module in order to gain a load currents value, wherein the digital voltage value is applied by the passive load model function, and then transferring the output voltage of the power product to a digital voltage value via the digital control module; and (S5) controlling the active electrical load module via the load current value so as to draw load currents from the power product, then a load current is generated, due to the output impedance, the output voltage of the power product will vary with the load current.

The user is able to adjust the plurality of parameters of the passive load model function, such as Rs, Ls, C, and $R_L$. The parameters will be applied into a load model, and the present voltage of the tested object is referred in time. Continuously, the load current is gained by way of the digital control technology, the high-speed analog-digital converter, the digital signal processor and the digital-analog converter in order to draw current from the tested object. Thus, the load characteristics of the real rectified passive component are simulated.

As a conclusion, the device 300 can precisely simulate the impedance characteristic of the rectified constant impedance load 100 to the power product 200. For that reason, it shall benefit the design and QC of the power product so as to improve liability and decrease cost.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A device for simulating a rectified constant impedance load being applied to test a power product, and comprising:
    an analog-digital converter electrically connected to the power product and configured to convert an output voltage of the power product to a digital voltage value;
    a digital signal processor electrically connected to the analog-digital converter and configured to let the digital voltage value be applied by a passive load model function for determining a load current value;
    a digital-analog converter electrically connected to the digital signal processor and configured to convert the load current value to an analog control signal; and
    an active electrical load module, wherein one end of the active electrical load module is electrically connected to the digital-analog converter and the other end of the active electrical load module is electrically connected to the power product, and the active electrical load module is configured to receive the analog control signal from the digital-analog converter and a rectified voltage, a load currents being produced according to the analog control signal and the rectified voltage.

2. The device for simulating a rectified constant impedance load according to claim 1, wherein the power product is an AC power product.

3. The device for simulating a rectified constant impedance load according to claim 1, wherein the passive load model function comprises a resistance value, a capacitance value, or the relationships of an induction value, a voltage value and a current value.

4. The device for simulating a rectified constant impedance load according to claim 1 further comprising a voltage/current measuring circuit electrically connected to the analog-digital converter and the power product and configured to measure the output voltage.

5. The device for simulating a rectified constant impedance load according to claim 1 further comprising a bridge rectifier electrically connected to the power product and the active electrical load module and configured to produce the rectified voltage.

6. The device for simulating a rectified constant impedance load according to claim 1, wherein the active electrical load module is an amplifier consisted of NPN-type bipolar junction transistors (BJT).

7. A device for simulating a rectified constant impedance load being applied to test a power product, and comprising:
    a digital control module configured to receive an output voltage of the power product and output an analog control signal; and
    an active electrical load module electrically connected to the digital control module and configured to produce a load current according to the analog control signal.

8. The device for simulating a rectified constant impedance load being applied to test a power product according to claim 7, wherein the digital control module comprises an analog-digital converter, a digital signal processor electrically connected to the analog-digital converter, and a digital-analog converter electrically connected to the digital signal processor and the active electrical load module.

9. A method for simulating a rectified constant impedance load being applied to test a power product and comprising the steps of:
    (S1) replacing a plurality of passive components of the rectified constant impedance load with a digital control module and an active electrical load module;

(S2) establishing a passive load model function in order to represent an application relationships of the plurality of the passive components;

(S3) executing an operation of the passive load model function by the digital control module in order to gain a load current value, and transferring the load current value to an analog control signal via the digital control module; and (S4) controlling the active electrical load module via the analog control signal so as to draw currents from the power product.

10. The method for simulating the rectified constant impedance load according to claim 9, between the step (S2) and the step (S3), further comprising the step of:

(S2') transferring the output voltage of the power product to a digital voltage value via the digital control module.

11. The method for simulating the rectified constant impedance load according to claim 9 further comprising the step of:

adjusting the plurality of parameters of the passive load model function, wherein the parameters comprise: a resistance value, a capacitance value, or an induction value, a voltage value and a current value.

* * * * *